US008482282B2

(12) United States Patent
Fautz

(10) Patent No.: US 8,482,282 B2
(45) Date of Patent: Jul. 9, 2013

(54) MAGNETIC RESONANCE METHOD AND APPARATUS TO DETERMINE K-SPACE POSITIONS FOR MODELING RADIO-FREQUENCY PULSES

(75) Inventor: Hans-Peter Fautz, Forchheim (DE)

(73) Assignee: Siemens Aktiengesellschaft, Munich (DE)

( * ) Notice: Subject to any disclaimer, the term of this patent is extended or adjusted under 35 U.S.C. 154(b) by 473 days.

(21) Appl. No.: 12/755,038

(22) Filed: Apr. 6, 2010

(65) Prior Publication Data

US 2010/0253344 A1    Oct. 7, 2010

(30) Foreign Application Priority Data

Apr. 6, 2009 (DE) .......................... 10 2009 016 341

(51) Int. Cl.
*G01R 33/48* (2006.01)
*A61B 5/05* (2006.01)
*G01V 3/00* (2006.01)

(52) U.S. Cl.
USPC ........... 324/309; 324/307; 324/310; 324/318; 600/410

(58) Field of Classification Search
USPC ........................ 324/300–322; 600/407–465
See application file for complete search history.

(56) References Cited

U.S. PATENT DOCUMENTS

| 7,078,901 | B2  | 7/2006  | Feiweier et al. |
|-----------|-----|---------|-----------------|
| 7,218,113 | B2  | 5/2007  | Feiweier et al. |
| 7,466,131 | B1* | 12/2008 | Xu et al. ........................ 324/318 |
| 8,063,637 | B2* | 11/2011 | Xu et al. ........................ 324/314 |
| 2005/0083054 | A1* | 4/2005 | Feiweier et al. .............. 324/307 |
| 2007/0013374 | A1* | 1/2007 | Griswold et al. ............. 324/309 |
| 2008/0238425 | A1* | 10/2008 | Xu et al. ........................ 324/322 |
| 2010/0127703 | A1* | 5/2010 | Sung et al. ..................... 324/309 |

OTHER PUBLICATIONS

"Exploring the Limits of RF Shimming for High-Field MRI of the Human Head," Mao et al., Magnetic Resonance in Medicine, vol. 56 (2006) pp. 918-922.
"Basic and Tailored RF Shimming in a Multi-transmit Whole Body MR System," Katscher, Progress in Electromagnetics Research Symposium, Cambridge, MA (2008) pp. 701-704.
Fast-$k_z$ Three-Dimensional Tailored Radiofrequency Pulse for Reduced $B_1$ Inhomogenity, Saekho et al., Magnetic Resonance in Medicine, vol. 55 (2006) pp. 719-724.
"Fast Slice-Selective Radio-Frequency Excitation Pulses for Mitigating $B_1$ Inhomogeneity in the Human Brain at 7 Tesla," Zelinski et al., Magnetic Resonance in Medicine, vol. 59 (2008) pp. 1355-1364.

(Continued)

*Primary Examiner* — Melissa Koval
*Assistant Examiner* — Emily Chan
(74) *Attorney, Agent, or Firm* — Schiff Hardin LLP

(57) ABSTRACT

In a method and a magnetic resonance apparatus for determining k-space positions for modeling RF pulses for exciting nuclear spins in a magnetic resonance sequence, a target magnetization is selected and a deviation thereof from a current achievable magnetization is determined. At least one maximum is localized in a spectrum of the deviation in k-space, and the k-space position of the localized maximum is stored, from which current pulse coefficients are determined that cause an optimal current magnetization to be achieved. This procedure is repeated until a termination criterion is satisfied, with the current pulse coefficients determined in this terminating repetition being used to generate an RF pulse to excite nuclear spins in a subject in the magnetic resonance sequence.

17 Claims, 2 Drawing Sheets

OTHER PUBLICATIONS

"Advanced Three-Dimensional Tailored RF Pulse for Signal Recovery in $T_2$-Weighted Functional Magnetic Resonance Imaging," Yip et al. Magnetic Resonance in Medicine, vol. 56 (2006) pp. 1050-1059.

"Spatial Domain Method for the Design of RF Pulses in Multicoil Parallel Excitation," Grissom et al., Magnetic Resonance in Medicine, vol. 56 (2006) pp. 620-629.

* cited by examiner

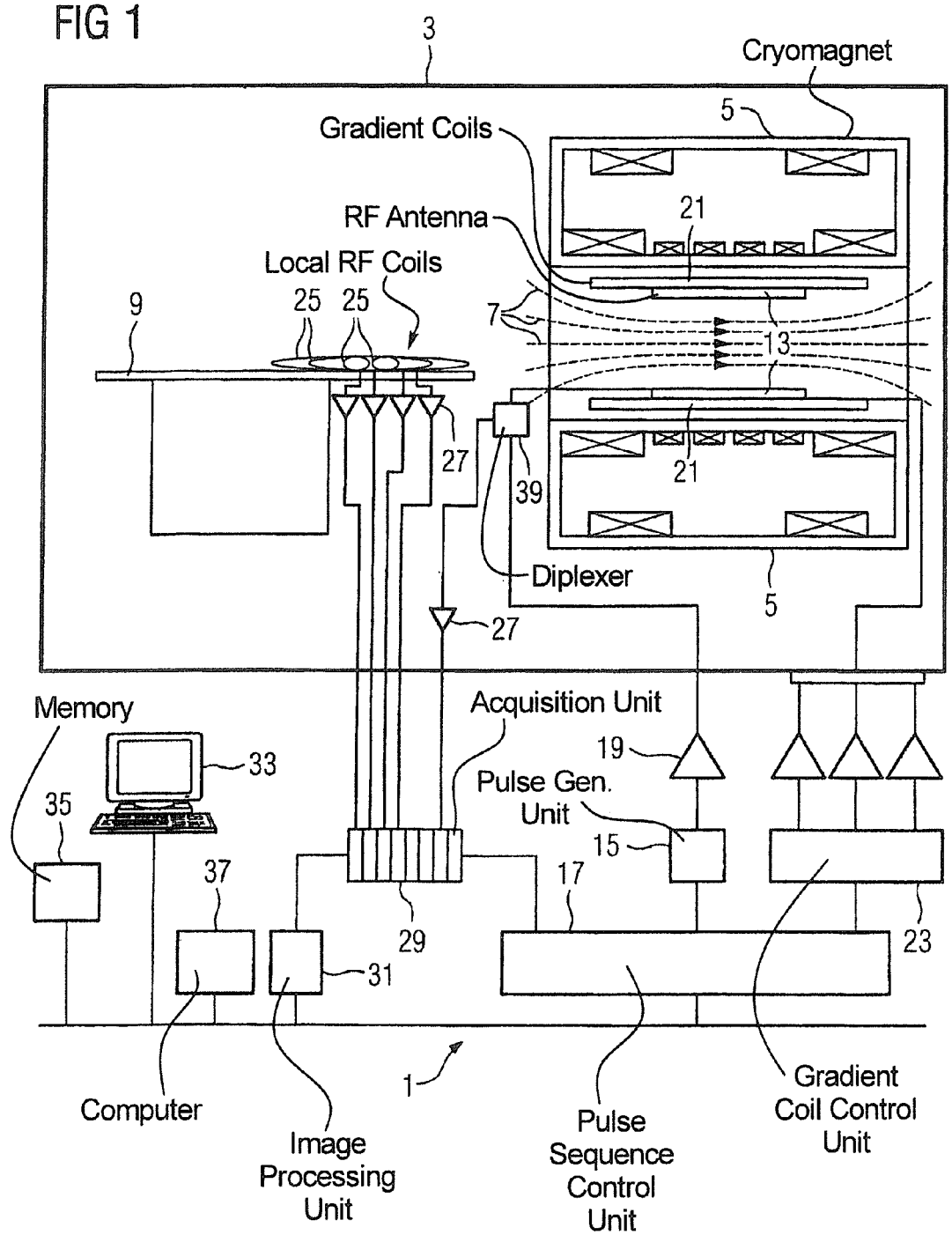

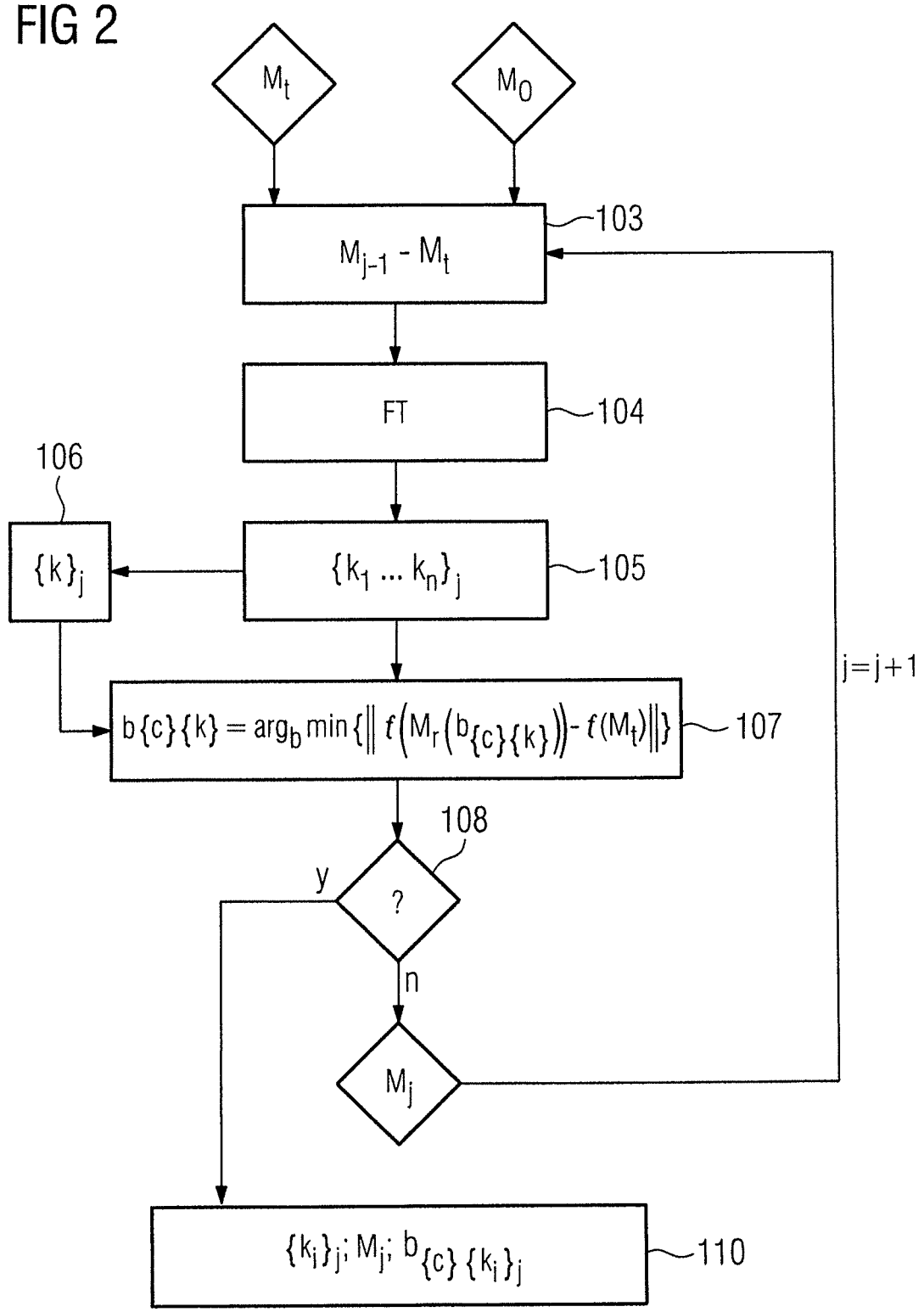

MAGNETIC RESONANCE METHOD AND APPARATUS TO DETERMINE K-SPACE POSITIONS FOR MODELING RADIO-FREQUENCY PULSES

BACKGROUND OF THE INVENTION

1. Field of the Invention

The present invention concerns a method to determine k-space positions for modeling radio-frequency (RF) pulses for magnetic resonance excitations, as well as a magnetic resonance apparatus and a computer-readable storage to implement the method.

2. Description of the Prior Art

One source of unwanted artifacts in magnetic resonance exposures (MR exposures) is spatial variations in the distribution of an applied radio-frequency field (RF field) in the examination volume (also called B1 or RF field inhomogeneities). These RF field inhomogeneities intensify as the strength of the basic magnetic field that is used is increased. Factors that lead to such RF field inhomogeneities are, for example, the local dielectric properties and the local conductivity properties in an examination subject that can shorten the RF wavelengths or, respectively, attenuate the RF amplitude. For example, spatially inhomogeneous RF fields generate locally different flip angles in the excitation and refocusing of the transverse magnetization of the nuclear spins. This leads to spatial variations of the MR signal strength and the image contrast (i.e. to unwanted, artificial shadowings in the MR image), particularly in whole-body imaging (breast, abdomen, pelvis), but also in head acquisitions (in particular at higher field strengths).

One method to regulate the spatial distribution of an excitation—in particular the excitation or, respectively, refocusing flip angle—is to directly affect the spatial distribution of the RF field via simultaneous transmission of RF pulses with multiple, spatially separated transmission coils. The respective phases and amplitudes are adjusted in the individual transmission channels so that the overlay of the individual fields corresponds to the desired RF distribution. This method is also called "RF shimming". It is robust, independent of the flip angle to be achieved, efficient with regard to the specific absorption rate (SAR) and largely independent of the MR acquisition sequence that is used. However, the degree to which homogeneity of the RF field that can be achieved with this method is limited. The achievable homogeneity in particular depends on the number of available parallel transmission channels. Providing independent transmission channels is expensive.

An additional method to affect the spatial distribution of excitation and refocusing flip angles is known as spatially selective excitation in the examination subject. A spatial modulation of the generated transverse magnetization is achieved by simultaneous action of RF and gradient pulses on the spin system in the examination subject. In principle, the spatial homogeneity of an RF excitation or refocusing that can be achieved in this manner is not limited, but the RF pulses that are required for this require disadvantageously long pulse times. However, the pulse times in the spatially selective excitation can in principle be shortened again by a parallel transmission with multiple transmission coils.

A known method for modeling RF pulses (in particular for a spatially selective excitation) is the original "spokes method" introduced by Saekho, which is described, for example, in Saekho et al.: "Fast-kz Three-Dimensional Tailored Radiofrequency Pulse for Reduced B1 Inhomogeneity", Magnetic Resonance in Medicine 55:719-724 (2006).

The "spokes method" uses short gradient pulses ("spokes") that are radiated between a few RF pulse segments. The k-space trajectory (associated with the gradient trajectory through the time integral) represents the path in k-space in which data are entered at individual points in k-space, but describes only a few k-space positions in the frequency space corresponding to the image plane. However, the ability with such a "spokes method" to an achieve homogeneity of the generated transverse magnetization can fluctuate significantly with a chosen number and selection of k-space positions of the spokes that are used. An applicable flip angle range and the SAR efficiency also depend on the selected k-space positions.

In different variants of the "spokes method" different approaches exist to choose the k-space positions that are used. In most cases—as in the article from Saekho that was already cited—the number and the coordinate of the k-space positions are simply provided by default.

Other variants attempt to optimize at least the positioning of the spokes. For example, Yip et al., "Advanced Three-Dimensional Tailored RF Pulse for Signal Recovery in T2*-Weighted Functional Magnetic Resonance Imaging", Magnetic Resonance in Medicine 56:1050-1059 (2006) describes how a positioning of a predetermined number N of k-space positions to be used can be determined from the spectrum of the desired excitation pattern. The N k-space positions with the highest energies are thereby selected from the spectrum of the desired excitation pattern as k-space positions that are to be used. This method is limited, however, to only the transmission with one channel.

Other variants also attempt to optimize the number of spokes. For example, Zelinski et al.: "Fast Slice-Selective Radio-Frequency Excitation Pulses for Mitigation B1+Inhomogeneity in the Human Brain at 7 Tesla", Magnetic Resonance in Medicine 59:1355-1364 (2008), describes how to reduce a number of spokes at discrete k-space positions to a low number by means of a complex mathematical method. Due to its high complexity, this method requires significant computing time. Moreover, it is not taken into account how robust an RF pulse optimized in this manner is against measurement errors in the calculation of detailed parameters (in particular those known as "B1 maps" that represent an achieved transversal magnetization) for the determination of a desired excitation pattern and against system imperfections. Moreover, the complex mathematical solutions are physically less transparent.

SUMMARY OF THE INVENTION

An object of the present invention to provide a method, a magnetic resonance apparatus and a computer-readable medium encoded with programming instructions that enable a fast a simple determination of k-space positions for modeling of RF pulses.

A method according to the invention for the determination of k-space positions for modeling of RF pulses for magnetic resonance excitations includes the following steps:
 (a) select a target magnetization,
 (b) select a first achievable magnetization as a current achievable magnetization,
 (c) determine a deviation of the current achievable magnetization from the target magnetization,
 (d) determine the spectrum of the deviation in k-space as a current spectrum,
 (e) localize at least one maximum in the current spectrum,
 (f) store the k-space positions of the localized maxima in a set of previously determined k-space positions, g) determine current pulse coefficients with which an optimal, current magnetization can be achieved using at least one k-space position from the set of previously determined k-space positions, and (h) repeat (c) through (g) until a predeterminable termination criterion is satisfied (but at least once) and, wherein in each repetition at least one k-space position is used in the determination of current pulse coefficients that was used in none of the preceding determinations of current pulse coefficients.

K-space positions for a modeling of RF pulses (i.e. for a determination of pulse coefficients that characterize the RF pulses) are determined iteratively via the repetitions with such a method. The pulse coefficients are also optimized with each repetition. No k-space positions must be known in advance, or estimated. A number of necessary k-space positions also do not need to be predetermined; rather, it can likewise be iteratively determined via the termination criterion.

A magnetic resonance apparatus according to the invention has at least one (advantageously more than one) radio-frequency transmission coil to transmit radio-frequency pulses; at least one pulse generation unit to generate the radio-frequency pulses sent by the radio-frequency transmission coil; a pulse sequence control unit to control the at least one pulse generation unit; and a computer that is fashioned to implement a method described above to determine k-space positions, and that is connected with the pulse generation unit via the pulse sequence control unit such that the pulse generation unit generates radio-frequency pulses on the basis of the determined k-space positions.

A computer-readable storage medium according to the invention is encoded with programming instructions that implements a method described above to determine k-space positions on a computer that is connected with a magnetic resonance apparatus, when the programming instructions are executed by the computer.

The advantages described with regard to the method analogously apply for the magnetic resonance apparatus and the computer-readable storage medium.

BRIEF DESCRIPTION OF THE DRAWINGS

FIG. 1 schematically illustrates a magnetic resonance apparatus in accordance with the invention.

FIG. 2 is a flowchart of an exemplary embodiment of the inventive method.

DESCRIPTION OF THE PREFERRED EMBODIMENTS

FIG. 1 schematically shows the design of the basic component of a magnetic resonance apparatus 1 with its essential components. In order to examine a body by means of magnetic resonance imaging, different magnetic fields, matched to one another as precisely as possible with regard to their temporal and spatial characteristics, are radiated into the body.

A strong magnet (typically a cryomagnet 5 with a tunnel-shaped opening) arranged in a radio-frequency-shielded measurement chamber 3 generates a static, strong basic magnetic field 7 that typically amounts to 0.2 Tesla to 7 Tesla or more. An examination subject (for example a patient, not shown) to be examined is supported on a patient bed 9 and is positioned in the homogeneous region of the basic magnetic field 7.

The excitation of the nuclear spins in the examination subject ensues by magnetic radio-frequency pulses (RF pulses) that are radiated by at least one radio-frequency transmission coil (for example a radio-frequency transmission coil shown here as a body coil 13) and possibly local radio-frequency transmission coils. The radio-frequency excitation pulses are generated by a pulse generation unit 15 that is controlled by a pulse sequence control unit 17. After an amplification by a radio-frequency amplifier 19, they are relayed to the at least one radio-frequency transmission coil. The radio-frequency system shown here is only schematically indicated with two respective pulse generation units 15 and radio-frequency amplifiers 19. Typically more pulse generation units 15 and more radio-frequency amplifiers 1 are used (for example one per radio-frequency transmission coil) in a magnetic resonance apparatus 1, such that each radio-frequency transmission coil receives its own transmission channel.

Furthermore, the magnetic resonance apparatus 1 has gradient coils 21 with which magnetic gradient fields are radiated in a measurement (data acquisition), among other things for selective slice excitation and for spatial coding of the measurement signal.

The gradient coils 21 are controlled by a gradient coil control unit 23 that—like the pulse generation unit 15—is connected with the pulse sequence control unit 17.

The signals emitted by the excited nuclear spins are received by local acquisition coils 25 and/or by at least one of the at least one radio-frequency transmission coils (for example the body coil 13) if this can also be operated in acquisition mode, are amplified by associated radio-frequency preamplifiers 27 and are additionally processed and digitized by an acquisition unit 29.

Given a coil that can be operated both in transmission mode and in acquisition mode (for example the body coil 13), the correct signal relaying is regulated by an upstream transmission/reception diplexer 39.

A computer 37 controls the individual components of the magnetic resonance apparatus 1, in particular during the excitation of the nuclear spins in the examination subject and during the acquisition of the measurement data. For this the computer 37 is connected with a memory unit 35 in which (for example) intermediate results of the processing of measurement data (for example raw data) and data to be used for the generation of the excitation of the nuclear spins can be stored and recalled again. Such data (for example about the desired type of the excitation or parameters for a modeling of a pulse for an excitation) can, for example, also be input by a user via an operator console 33 and be supplied to the memory unit 35 and/or the computer 37.

The computer 37 controls the pulse generation units 15 via the pulse sequence control unit 17 such that RF pulses modeled by means of the computer 37 are generated.

The computer 37 is fashioned so that the method according to the invention can be implemented with it. For example, for this purpose a computer program 40 according to the invention is installed in the computer 37 such that it can be executed; when the method according to the invention is implemented on the computer 37 by being executed on the computer 37.

The shown units (in particular the computer 37 and the memory unit 35) are hereby not necessarily to be understood as a physical unit; rather, they can be composed of multiple partial units that are possibly arranged separately in space.

FIG. 2 shows a schematic workflow diagram of an exemplary embodiment of the method to determine k-space positions for a modeling of RF pulses. K-space positions for the modeling of RF pulses are determined in N iterations ($N \geq 2$).

A target magnetization $M_t$ is thereby initially selected and an initial magnetization $M_0$ is chosen as a current achievable magnetization $M_{j-1}$ (j=1, ..., N).

The target magnetization $M_t$ thereby corresponds to a desired excitation (for example a desired flip angle) in a region to be examined in the examination subject. For example, the target magnetization $M_t$ can be a magnetization that is constant in the volume to be examined (as in the article by Yip et al. that was previously cited), meaning that the target magnetization is selected so that an excitation is homogeneous in the volume to be examined. The RF pulse to be modeled and that is sought with regard to such a target magnetization thus serves here for a selective excitation for homogenization of the RF distribution in the examined volume. A region to be examined in the examination subject hereby does not need to correspond to the entire excited region in the examination subject, but rather can be only a partial region (for example an organ to be examined) of the excited region.

The initial magnetization $M_0$ will typically be equal to zero ($M_0$=0) since no pulse coefficients are provided to achieve a different magnetization. In principle, however, it is likewise conceivable to start the method assuming any known initial magnetization $M_0$, for example a magnetization achievable with known pulse coefficients.

In a next Step 103 a deviation of the current achievable magnetization $M_{j-1}$ from the target magnetization $M_t$ is determined. The determination of the deviation hereby occurs particularly simply via subtraction of the target magnetization $M_t$ from the currently achievable magnetization $M_{j-1}$ ($M_{j-1}-M_t$), in particular via subtraction of the absolute value of the target magnetization $|M_t|$ from the absolute value of the currently achievable magnetization $|M_{j-1}|$ ($|M_{j-1}|-|M_t|$) or via subtraction of the complex-value target magnetization $M_t$ from the complex-value, currently achievable magnetization $M_{j-1}$. The deviation is advantageously determined by calculating a norm of the cited difference ($\|| M_{j-1}|-|M_t| \|$ and $\| M_{j-1}-M_t \|$).

In the first iteration (j=1) the deviation can thus be determined via subtraction of the target magnetization $M_t$ from the initial magnetization $M_0=M_{j-1}$ and form a norm of this difference. If the initial magnetization is equal to zero, the deviation in the first iteration (j=1) corresponds to the target magnetization or, respectively, to the selected norm of the target magnetization.

The spectrum in k-space is then (Step 104) determined from the determined deviation as a current spectrum, for example by implementing a Fourier transformation (FT) of the deviation.

In a next Step 105, at least one maximum is localized in the current spectrum. This means that the k-space position of at least one maximum (up to a number n of maxima) of the current spectrum is determined. Methods for localization of maxima in spectra are known in the prior art. A number of maxima whose k-space positions are localized are hereby advantageously predeterminable.

A simple manner of choosing which maxima of the current spectrum should be localized in Step 105 is, for example, to select the maxima with the highest energies in the current spectrum.

If a homogeneous excitation in the volume to be examined was selected as a target magnetization $M_t$, the k-space position k=0 (k-space center) is also automatically determined in the localization of the maxima. The aforementioned "RF shimming" is inherently incorporated into the method, which can be further developed.

The n k-space positions $\{k_{1\ldots n}\}_j$ ($n \geq 1$) of the n localized maxima that are determined in this manner in the j-th iteration are stored in a set of previously determined k-space positions $\{k\}_j$ in a further Step 106. Thus all k-space positions of the maxima localized in the j preceding iterations are comprised in the set of previously determined k-space positions.

Using at least one k-space position from the set of previously determined k-space positions, in a further Step 107 current pulse coefficients $b_j$ are determined with which an optimal, current magnetization $M_j(b_j)$ can be achieved. In particular, k-space positions $\{k_i\}_j$ that should be used to determine current pulse coefficients are hereby selected from the set of previously determined k-space positions $\{k\}_j$. The selected k-space positions $\{k_i\}_j$ are thereby a subset of the previously determined k-space positions $\{k\}_j$ and contain at least one of the k-space positions $\{k_{1\ldots n}\}_j$ directly determined in the running iteration. Details regarding the determination of the current pulse coefficients are stated further below.

Pulse coefficients $b_{\{k_i\}_j}$ determined with regard to k-space positions $\{k_i\}_j$ that are used and/or the associated current, optimal achievable magnetization $M_j$ can likewise be stored (for instance in the memory unit 35 from FIG. 1) as intermediate results for a later use (not shown), for example.

In the following Steps 103 through 107 are repeated at least once (j=j+1) in order to bring about an iterative determination of the k-space positions. Steps 103 through 107 are thereby repeated until a predeterminable termination criterion 108 is satisfied, wherein at least one k-space position that was used in no preceding determination of current pulse coefficients is used in the determination of current pulse coefficients in each repetition.

For the first repetition of Steps 103 through 107 the optimal current magnetization $M_1$ that can be achieved with the pulse coefficients $b_i$ determined in the iteration j=1 is thus used in the next iteration j=2 in Step 103, and the deviation of the current achievable magnetization $M_1$ from the target magnetization $M_t$ is determined. New k-space positions $\{k_{1\ldots n}\}_2$ that can be used in Step 107 in order to determine current, optimized pulse coefficients are determined (Step 105, j=2) from the spectrum of the deviation of the current achievable magnetization $M_1$ from the target magnetization $M_2$ by the localization of the maxima of this spectrum, this spectrum being determined in the Step 104 in the second iteration.

Through the repetition of Steps 103 through 107, the k-space positions determined in the method are iteratively optimized. Therefore, no k-space positions need to be known, estimated or otherwise predetermined in advance. Instead, optimized k-space positions are determined automatically in the course of the method.

Before a further repetition of Steps 103 through 107 (j≧3) is implemented, the predeterminable termination criterion 108 is checked, and only if it is not satisfied is a further repetition implemented. If the termination criterion is satisfied, the current k-space positions $\{k_i\}_j$ in the last iteration and possibly the associated pulse coefficients $b_j$ and/or the associated optimal achievable magnetization $M_j$ can be stored, for example in the memory unit 35 for use for a generation of corresponding RF pulses in a magnetic resonance apparatus 1 from FIG. 1.

For example, at least one or a predeterminable combination of the following conditions are considered as a termination criterion 108:

the determination of the current achievable magnetization from the target magnetization in the last iteration falls below a predeterminable first threshold, a number of k-space positions used in the determination of current pulse coefficients reach a predeterminable second threshold, the number of repetitions of the determination of current pulse coefficients reaches a predeterminable third threshold, i.e. the number of iterations of Steps 103 through 107 reaches the predeterminable third threshold.

If the termination criterion is satisfied, the k-space positions $\{k_i\}_j$ used in the last determination of current pulse coefficients and/or the magnetization $M_j$ achievable with the last determined pulse coefficients $b_j$ and/or the last determined pulse coefficients themselves can be stored as a result.

For the determination of the pulse coefficients in Step 107, the matrix formalism for small flip angle excitation can be used as it is in particular described in, for example, the article by Grissom et al.: "Spatial Domain Method for the Design of RF Pulses in Multicoil Parallel Excitation", Magnetic Resonance in Medicine 56:620-629 (2006).

In this matrix format a magnetization $M_r$ generated with pulse coefficients in a set of pixels $\{r\}$ can be written as a product of a matrix A and a vector b of the pulse coefficients: $M_r = A_r^{\{c\}\{k\}} b_{\{c\}\{k\}}$, wherein both the matrix A and the pulse coefficients of k-space positions $\{k\}$ and possibly of radio-frequency transmission coils $\{c\}$ used for a transmission of RF pulses corresponding to the pulse coefficients hereby in particular depend on the transmission sensitivities of the radio-frequency transmission coils. For details see, for example, the cited article by Grissom et al.

For modeling of an RF pulse the matrix formalism can be used in order to obtain optimal pulse coefficients b by solving an optimization problem. With pulse coefficients or, respectively, their vectors b the optimization problem thereby approximates an achievable magnetization $M_r$ of a given target magnetization $M_t$.

For example, the argument of the minimum (arg min) of a norm $\|\bullet\|$ of the deviation of a function of the achievable magnetization depending on the pulse coefficients of the same function of the target magnetization can be used as an optimization problem:

$$b_{\{c\}\{k\}} = \arg_b \min \|f(M_r(b_{\{c\}\{k\}}); M_t\|, \text{with } M_r(b_{\{c\}\{k\}}) = A_r^{\{c\}\{k\}} b_{\{c\}\{k\}}.$$

for example, the respective absolute value of the achievable magnetization $M_r$ or, respectively, the target magnetization $M_t$ are considered as a function for $f(M_r)$ and $f(M_t)$, in which case:

$$f(M_r(b_{\{c\}\{k\}}); M_t) = |M_r(b_{\{c\}\{k\}}) - M_t| \text{ and } f(M_t) = |M_t|.$$

It is likewise conceivable to use as a function for $f(M_r)$ and $f(M_t)$ not the absolute values but rather, for example, the respective complex values of the achievable magnetization $M_r$ or, respectively, the target magnetization $M_t$, in which case not only the absolute value of a desired target magnetization $M_t$ is specified but also its phase $\phi$, and:

$$f(M_r(b_{\{c\}\{k\}}); M_t) = M_r(b_{\{c\}\{k\}}) - M_t \text{ and [sic], with } M_t = |M_t|e^{i\phi}$$

Additional functions are likewise conceivable. In the following, for the sake of clarity one respective absolute value function is specified as a function for the optimization problem.

However, in the known methods the k-space positions $\{k\}$ must respectively be predetermined once for this. Contrarily, in the method according to the invention the k-space positions are advantageously iteratively optimized.

For this in each iteration in Step 107 k-space positions $\{k_i\}_j$ from the set of the previously determined k-space positions $\{k\}_j$ are used in the determination of current pulse coefficients $b_j$, wherein at least one k-space position is used in the determination of current pulse coefficients that has not been used in any preceding determination of current pulse coefficients, but rather was only determined as a k-space position $\{k_1 \ldots n\}_j$ of a maximum localized in the current iteration.

In particular given the use of multiple radio-frequency transmission coils, in the determination of the pulse coefficients it is also advantageous to take into account their dependency on the radio-frequency transmission coils that are used, for example as occurs in the article by Grissom et al. that was already cited. In the following the index $\{c\}$ is therefore carried along to clarify this dependency and to clarify that c pulse coefficients are determined for every radio-frequency coil that is used.

In a first exemplary embodiment precisely one maximum is respectively localized in the respective current spectrum in each iteration $j=1 \ldots N$ in Step 105, and its k-space position $k_j$ is used for the determination of the respective current pulse coefficients $b_j = b_{\{c\}\{k_i\}_j}$ with $k_j \in \{k_i\}_j$. The number of previously determined k-space position thus rises by one with each iteration, meaning that N k-space positions have been determined after N iterations.

For example, in every iteration respectively only the pulse coefficient $b_{\{c\}k_j}$ for the presently determined k-space position $k_j$ can thereby be determined as further pulse coefficients, and pulse coefficients $b_{\{c\}\{k_1 \ldots k_{j-1}\}}$ already determined in preceding iterations are retained in order to obtain the current pulse coefficients $b_{\{c\}\{k_1 \ldots k_j\}}$.

The determination of the pulse coefficients $b_{\{c\}k_j}$ thus ensues as follows (for example using an absolute value function in the optimization):

$$b_{\{c\}k_j} = \arg_b \min\{\|A_r^{\{c\}k_j} b_{\{c\}k_j} + M_{j-1}| - |M_t|\|\},$$

with $$M_{j-1} = A_r^{\{c\}\{k_1 \ldots k_{j-1}\}} b_{\{c\}\{k_1 \ldots k_{j-1}\}}.$$

The optimal current achievable magnetization $M_j$ is thus hereby equal to a superposition of the magnetization $M_{j-1}$ achievable with the pulse coefficients $b_{\{c\}\{k_1 \ldots k_{j-1}\}}$ already determined in preceding iterations with an achievable magnetization $A_r^{\{c\}k_j} b_{\{c\}k_j}$ of the newly determined pulse coefficients $b_{\{c\}k_j}$ that can be optimized depending on the already determined k-space position $k_j$.

It is hereby also conceivable to specify the current achievable magnetization $M_j$ as a superposition of the achievable magnetization $A_r^{\{c\}k_j} b_{\{c\}k_j}$ optimized depending on the presently determined k-space position $k_j$ and a magnetization achievable with only a subset $b_{\{c\}\{k_i\}_{j-1}}$ of the previously determined pulse coefficients $b_{\{c\}\{k_i\}_{j-1}}$. In this case, in the above equation $M_{j-1} = A_r^{\{c\}\{k_i\}_{j-1}}$.

The current pulse coefficients hereby comprise the subset $b_{\{c\}\{k_i\}_{j-1}}$ of the previously determined pulse coefficients $b_{\{c\}\{k_1 \ldots k_{j-1}\}}$ and the additional pulse coefficients $b_{\{c\}k_j}$ determined in the running iteration.

The solution space for the optimization problem is in fact limited by retaining pulse coefficients already determined in preceding iterations; a decreasing weighting of the additional pulse coefficients is therefore obtained in this way. This means that additional pulse coefficients determined in repetitions of Steps 103 through 107 (thus in iterations) are essentially only respective corrections to the previously determined current pulse coefficients. The complexity of an RF pulse defined after termination of the method via the last determined pulse coefficients can be linked directly with the order of the correction (thus the number of repetitions in the method. A consideration between a desired precision to be achieved (for example the homogenization of RF field-dependent inhomogeneities that can be achieved with the RF pulse) and a robustness of the RF pulse can thus simply be made under consideration of the number of repetitions.

Alternatively, in each iteration all previously determined k-space positions $\{k\}_{j-1}$ and the k-space position $k_j$ presently determined in the running iteration are used in the determination of the current pulse coefficients in order to optimize all pulse coefficients $b_{\{c\}\;\{k_1\ldots k_j\}}$.

The determination of the pulse coefficients $b_{\{c\}\;\{k_1\ldots k_j\}}$ thus ensues here as follows (for example using an absolute value function in the optimization):

$$b_{\{c\}\;\{k_1\ldots k_j\}} = \arg_b \min\{\|M_j - M_t\|\}$$

with $$M_j = A_r^{\{c\}\;\{k_1\ldots k_j\}}$$

The solution space provided for the optimization is hereby greater than given the retention of already determined pulse coefficients that is described above. The optimization can thus be freer and therefore normally can be implemented more effectively. A "more optimal" result can thus be achieved. However, the already determined pulse coefficients are also advantageously used here as start values for the optimization. A weighting of the iteratively determined pulse coefficients is thereby likewise generated; however, this is markedly less than in the method described above with retention of already determined pulse coefficients.

Additional alternatives in the determination of the current pulse coefficients result from, for example, mixing of the described variants. For example, this can be accomplished by retaining a selectable subset of previous already determined pulse coefficients, and determining additional pulse coefficients using the at least one previously unused k-space position.

In another exemplary embodiment, a predeterminable number n of maxima in the respective current spectrum are respectively localized in each iteration $j=1,\ldots,N$ in Step 105, and their k-space positions $\{k_1\ldots k_n\}_j$ are used for the determination of the respective current pulse coefficients $b_j = b_{\{c\}\;\{k_i\}_j}$ with at least one of the presently determined k-space positions $\{k^1\ldots k^n\}\in\{k_i\}_j$. The number of previously determined k-space positions can thus increase with each iteration by a value greater than one (maximally by the value of n). A greater number of k-space positions and associated pulse coefficients can already be determined in this way in a few iterations.

In this exemplary embodiment the alternatives cited in relation to the first exemplary embodiment are also applicable in the determination of the pulse coefficients. This means that either already determined pulse coefficients are retained in each iteration and additional pulse coefficients are determined using at least one of the k-space positions determined in the current, running iteration; or only a subset of the already determined pulse coefficients is retained and additional pulse coefficients are determined using at least one of the k-space positions determined in the current, running iteration; or all current pulse coefficients to be determined are newly determined in each iteration using at least one subset of the k-space positions already determined in preceding iterations and at least one of the k-space positions determined in the current, running iteration.

With such a method it is thus possible to iteratively obtain k-space positions for a determination of pulse coefficients, i.e. for a modeling of RF pulses. In particular a consideration of radio-frequency transmission coils used for the generation of the RF pulses is hereby possible. Precisely if multiple radio-frequency transmission coils with individual sensitivities and individual transmission channels are used is it advantageous to incorporate the radio-frequency transmission coils into the modeling of the RF pulses, and hereby already into the selection of the k-space positions used for the modeling of the RF pulses. The method is thus in particular also suitable for multichannel transmission systems with multiple radio-frequency transmission coils and multiple transmission channels.

Although modifications and changes may be suggested by those skilled in the art, it is the intention of the inventor to embody within the patent warranted hereon all changes and modifications as reasonably and properly come within the scope of his contribution to the art.

I claim as my invention:

1. A method to determine k-space positions for modeling radio-frequency (RF) pulses for exciting nuclear spins in an examination subject to cause emission of magnetic resonance signals, comprising the steps of:
   (a) selecting a target magnetization in the examination subject for excitation of nuclear spins in the examination subject by radiation of an RF pulse;
   (b) selecting a first achievable magnetization in the examination subject, as a current achievable magnetization;
   (c) in a processor, automatically determining a deviation of the current achievable magnetization from the target magnetization;
   (d) in said processor automatically determining a spectrum of the deviation in k-space as a current spectrum;
   (e) in said processor, localizing at least one maximum in said current spectrum;
   (f) from said processor, storing k-space positions of said at least one localized maximum in a set of previously determined k-space positions;
   (g) in said processor, automatically determining current pulse coefficients for producing said RF pulse for exciting said nuclear spins in the examination subject, with which an optimal, current magnetization can be achieved using at least one k-space position from said set of previously determined k-space positions;
   (h) repeating steps (c) through (g) at least once until a predetermined termination criterion is satisfied and, in each repetition, using at least one k-space position to determine current pulse coefficients that was used in no preceding determination of current pulse coefficients; and
   (i) making the current pulse coefficients determined in (h), in the repetition in which said termination criterion is satisfied, available as electronic signals at an output of said processor in a form for controlling an RF pulse generator to emit an rf pulse corresponding to said current pulse coefficients determined in (h).

2. A method as claimed in claim 1 wherein step (e) comprises localizing only one maximum in said current spectrum.

3. A method as claimed in claim 1 comprising retaining each current pulse coefficient determined in step (g).

4. A method as claimed in claim 1 comprising, in step (h) using all previously used k-space positions, and said at least one previously unused k-space position, to determine said current pulse coefficients.

5. A method as claimed in claim 1 comprising retaining a selected subset of the previous determined pulse coefficients in step (g), and determining additional pulse coefficients using said subset and said at least one previously unused k-space position.

6. A method as claimed in claim 1 comprising, in repeating steps (c) through (g), determining a predetermined number of localized maxima in each repetition.

7. A method as claimed in claim 1 wherein step (d) comprises determining said spectrum by Fourier transformation.

8. A method as claimed in claim 1 wherein step (g) comprises determining said current pulse coefficients depending on radio-frequency transmission coils used to excite said nuclear spins.

9. A method as claimed in claim 1 wherein step (g) comprises determining said current pulse coefficients by solving an optimization problem that approximates the optimal achievable magnetization to the target magnetization according to a predetermined function of the target magnetization and the achievable magnetization.

10. A method as claimed in claim 9 comprising employing an absolute value function as said function.

11. A method as claimed in claim 9 comprising employing a complex function as said function.

12. A method as claimed in claim 1 wherein step (e) comprises localizing at least one maximum having a highest energy in said current spectrum.

13. A method as claimed in claim 1 comprising setting an initial magnetization in said examination subject to a value of zero.

14. A method as claimed in claim 1 comprising employing a termination criterion in step (h) selected from the group consisting of the deviation of the current achievable magnetization from the target magnetization being below a predetermined first threshold, a number of k-space positions used to determine said current pulse coefficients reaches a predetermined second threshold, and a number of repetitions of steps (c) through (g) reaches a predetermined third threshold.

15. A method as claimed in claim 1 comprising setting said target magnetization in step (a) to cause inhomogeneities of an RF field distribution in the examination subject, during acquisition of magnetic resonance data from the examination subject, to be compensated by said target magnetization.

16. A magnetic resonance apparatus to determine k-space positions for modeling radio-frequency (RF) pulses for exciting nuclear spins in an examination subject to cause emission of magnetic resonance signals, comprising:
- a processor having an input supplied with a target magnetization in the examination subject;
- said processor being configured to determine a first achievable magnetization in the examination subject, as a current achievable magnetization;
- said processor being configured to (i) determine a deviation of the current achievable magnetization from the target magnetization;
- said processor being configured to (ii) determine a spectrum of the deviation in k-space as a current spectrum;
- said processor being configured to (iii) localize at least one maximum in said current spectrum;
- a memory accessible by said processor;
- said processor being configured to (iv) store k-space positions of said at least one localized maximum in said memory in a set of previously determined k-space positions;
- said processor being configured to determine current pulse coefficients for an RF pulse for exciting nuclear spins in the examination subject, with which an optimal, current magnetization can be achieved using at least one k-space position from said set of previously determined k-space positions, and to repeat (i) through (iv) at least once until a predetermined termination criterion is satisfied and, in each repetition, using at least one k-space position to determine current pulse coefficients that was used in no preceding determination of current pulse coefficients;
- a magnetic resonance data acquisition unit comprising an RF system; and
- said processor being configured to operate said magnetic resonance data acquisition unit to execute a magnetic resonance data acquisition pulse sequence comprising at least one RF pulse having said current pulse coefficients determined at a time when said predetermined termination criterion is satisfied.

17. A non-transitory computer-readable storage medium encoded with programming instructions, said medium being loaded into a computerized control and processing system of a magnetic resonance apparatus comprising a magnetic resonance data acquisition unit, said programming instructions causing said computerized control and processing system to:
(a) select a target magnetization in the examination subject;
(b) select a first achievable magnetization in the examination subject, as a current achievable magnetization;
(c) automatically determine a deviation of the current achievable magnetization from the target magnetization;
(d) automatically determine a spectrum of the deviation in k-space as a current spectrum;
(e) localize at least one maximum in said current spectrum;
(f) store k-space positions of said at least one localized maximum in a set of previously determined k-space positions;
(g) automatically determine current pulse coefficients for an RF pulse for exciting nuclear spins in the examination subject, with which an optimal, current magnetization can be achieved using at least one k-space position from said set of previously determined k-space positions;
(h) repeat steps (c) through (g) at least once until a predetermined termination criterion is satisfied and, in each repetition, using at least one k-space position to determine current pulse coefficients that was used in no preceding determination of current pulse coefficients; and
(i) make the current pulse coefficients determined in (h), in the repetition in which said termination criterion is satisfied, available as electronic signals at an output of said processor in a form for controlling an RF pulse generator to emit an rf pulse corresponding to said current pulse coefficients determined in (h).

* * * * *